United States Patent
Okinaka et al.

(10) Patent No.: US 8,354,788 B2
(45) Date of Patent: Jan. 15, 2013

(54) ORGANIC LIGHT EMITTING DEVICE

(75) Inventors: Keiji Okinaka, Kawasaki (JP); Masataka Yashima, Tokyo (JP); Maki Okajima, Kawasaki (JP); Hajime Muta, Zama (JP)

(73) Assignee: Canon Kabushiki Kaisha, Tokyo (JP)

(*) Notice: Subject to any disclaimer, the term of this patent is extended or adjusted under 35 U.S.C. 154(b) by 34 days.

(21) Appl. No.: 12/919,968

(22) PCT Filed: May 14, 2009

(86) PCT No.: PCT/JP2009/059297
§ 371 (c)(1),
(2), (4) Date: Aug. 27, 2010

(87) PCT Pub. No.: WO2009/139501
PCT Pub. Date: Nov. 19, 2009

(65) Prior Publication Data
US 2011/0001864 A1    Jan. 6, 2011

(30) Foreign Application Priority Data

May 16, 2008 (JP) ................ 2008-129577
Apr. 13, 2009 (JP) ................ 2009-097227

(51) Int. Cl.
*H01J 1/62* (2006.01)
(52) U.S. Cl. .................. 313/504; 313/506
(58) Field of Classification Search ......... 313/498–512; 428/690, 917
See application file for complete search history.

(56) References Cited

U.S. PATENT DOCUMENTS

| | | | |
|---|---|---|---|
| 7,466,074 B2 | 12/2008 | Okinaka et al. | 313/504 |
| 7,491,450 B2 | 2/2009 | Okinaka et al. | 428/690 |
| 7,604,873 B2 | 10/2009 | Okinaka et al. | 428/690 |
| 2006/0113528 A1 | 6/2006 | Okinaka et al. | 257/40 |
| 2006/0182996 A1 | 8/2006 | Nakamura et al. | 428/690 |
| 2006/0222887 A1* | 10/2006 | Okada | 428/690 |
| 2007/0048547 A1 | 3/2007 | Chang et al. | 428/690 |
| 2007/0069636 A1 | 3/2007 | Choulis et al. | 313/504 |
| 2007/0111029 A1 | 5/2007 | Yamada et al. | 428/690 |
| 2007/0138945 A1 | 6/2007 | Hoshi et al. | 313/504 |
| 2008/0268285 A1 | 10/2008 | Okinaka et al. | 428/691 |

(Continued)

FOREIGN PATENT DOCUMENTS

JP         2000-252063         9/2000

(Continued)

OTHER PUBLICATIONS

Aziz, H. et al., "Degradation Mechanism of Small Molecule-Based Organic Light-Emitting Devices," Science, www.sciencemag.org, vol. 283, Mar. 19, 1999, pp. 1900-1902.

(Continued)

*Primary Examiner* — Bumsuk Won
(74) *Attorney, Agent, or Firm* — Fitzpatrick, Cella, Harper & Scinto

(57) ABSTRACT

An organic light emitting device having long continuous driving lifetime is provided. The organic light emitting device includes an anode, a cathode, and an emission layer formed of an organic compound arranged between the anode and the cathode, in which the emission layer includes a light emitting material and a material having a smallest ionization potential, and an absorption spectrum in a radical cation state of the material having the smallest ionization potential in the emission layer does not have its absorption peak in an emission wavelength region of the light emitting material.

14 Claims, 10 Drawing Sheets

U.S. PATENT DOCUMENTS

| | | | |
|---|---|---|---|
| 2009/0066227 A1 | 3/2009 | Okinaka et al. | 313/504 |
| 2009/0163743 A1 | 6/2009 | Hoshi et al. | 568/640 |
| 2009/0195179 A1* | 8/2009 | Joseph et al. | 315/287 |
| 2009/0278446 A1 | 11/2009 | Igawa et al. | 313/504 |
| 2010/0019236 A1 | 1/2010 | Okinaka et al. | 257/40 |

FOREIGN PATENT DOCUMENTS

| | | |
|---|---|---|
| JP | 2007-070352 | 3/2007 |
| JP | 2007-100083 | 9/2007 |
| WO | 02/15645 A1 | 2/2002 |
| WO | 2005/062677 A1 | 7/2005 |
| WO | 2006/080640 A1 | 8/2006 |

OTHER PUBLICATIONS

Kondakov, D., et al., "Operational degradation of organic light-emitting diodes: Mechanism and identification of chemical products," Journal of Applied Physics, vol. 101, 2007, pp. 024512-1 to 024512-7.

Kajigaeshi, S. et al., "Selective Preparation of Fluorene Derivatives Using the $t$-Butyl Function as a Positional Protective Group," Bull. Chem. Soc. Jpn., vol. 59, No. 1, 1986, pp. 97-103.

Tada, K. et al., "Color tuning of Poly($N$-vinylcarbazole)-Based Light-Emitting Devices through Maskless Dye-Diffusion Technique Using Phosphorescent Dyes," Japanese Journal of Applied Physics, vol. 47, No. 2, (2008) pp. 1290-1292.

* cited by examiner

US 8,354,788 B2

ORGANIC LIGHT EMITTING DEVICE

TECHNICAL FIELD

The present invention relates to an organic light emitting device using an organic compound, and more specifically, to an organic light emitting device that emits light by applying voltage to a thin film composed of an organic compound.

BACKGROUND ART

An organic light emitting device is driven by providing a thin film containing a luminous organic compound between an anode and a cathode, applying a voltage between the electrodes, and injecting a hole and an electron. The hole is recombined with the electron in the device to produce an exciton (excited state) of the luminous organic compound, and the organic light emitting device uses the emitted light when the exciton returns to a ground state.

Recent progress of an organic light emitting device is remarkable, and the characteristics of the device enable a light emitting device with a high luminance at a low applied voltage, a variety of emission wavelengths, high-speed responsiveness, thin shape, and light weight. From this fact, it is suggested that the organic light emitting device have potential to find use in a wide variety of applications.

However, when the application of the organic light emitting device to a display and the like is attempted, the stability of the current device has not been sufficient in practical use. In particular, it has necessary to ameliorate properties thereof due to the problem that light emitting efficiency deteriorates with time when the device is driven continuously.

The cause of the deterioration in the light emitting efficiency may reside in that the organic compound constituting the device deteriorates due to repeated oxidation and reduction by a charge injected from each electrode. It is indicated in Science, 283, 1900 (1999) that a factor of the deterioration of tris(8-quinolilato)aluminum ($Alq_3$) is unstability of a radical cation (cation) generated by hole transport. In addition, Japanese Patent Application Laid-Open No. 2007-70352 discloses that a specific aryl amine compound having resistance to an oxidation reaction is used for the purpose of ameliorating the deterioration.

In addition, another cause thereof may be the deterioration in a material undergoing the excited state of the compound in the emission layer. It is indicated, in Journal of Applied Physics 101, 024512 (2007), that a reaction mediated by the excited state is a factor of the material deterioration.

However, even if the resistance to oxidation and reduction of the compound and the stability at the excited state are ameliorated, the continuous driving durability has not been sufficient in practical use by conventional technologies.

DISCLOSURE OF THE INVENTION

The present invention provides an organic light emitting device, including: an anode; a cathode; and an emission layer formed of an organic compound arranged between the anode and the cathode, in which: the emission layer includes a light emitting material and a material having a smallest ionization potential; and an absorption spectrum in a radical cation state of the material having the smallest ionization potential in the emission layer does not have its absorption peak in an emission wavelength region of the light emitting material.

According to the present invention, an organic light emitting device having a long continuous driving lifetime may be obtained.

Further features of the present invention will become apparent from the following description of exemplary embodiments with reference to the attached drawings.

BEST MODE FOR CARRYING OUT THE INVENTION

Figure 1:
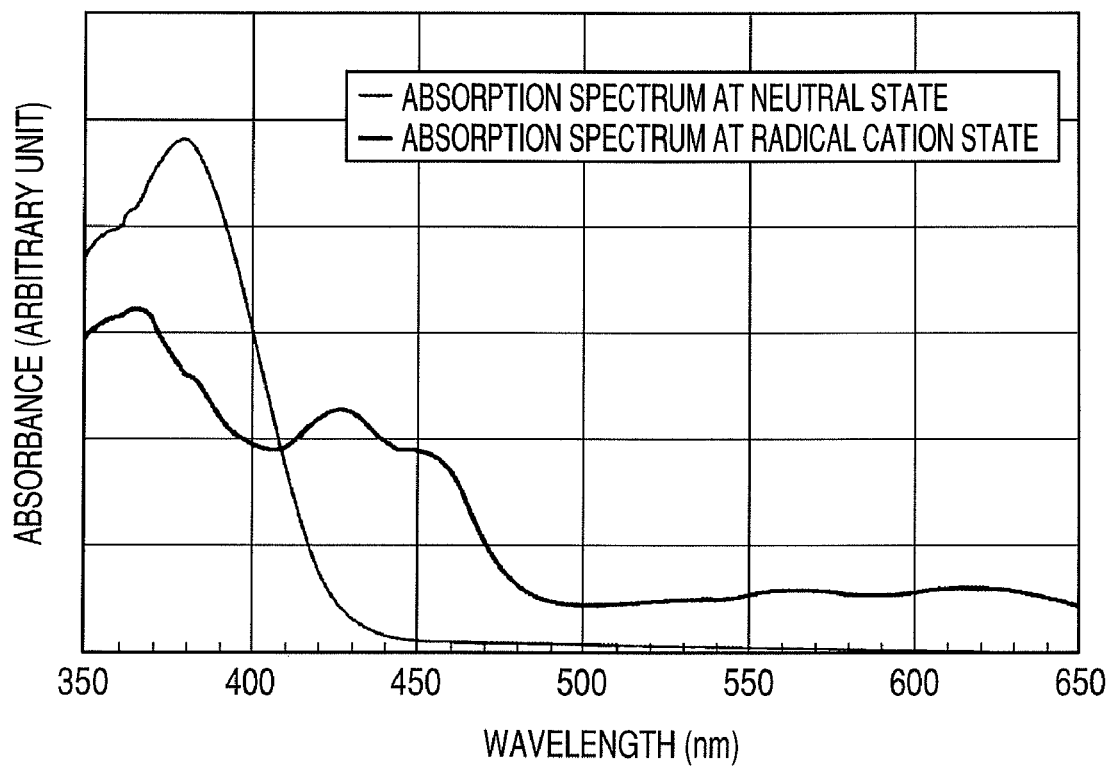
FIG. 1 illustrates absorption spectra of Compound 2 in a neutral state and in a radical cation state.

The inventors of the present invention attempted to develop a device capable of improving continuous driving durability by an approach different from conventional technologies. More specifically, the inventors attempted to ameliorate the route which causes the deterioration.

First, the inventors noticed the following phenomenon: a compound in a radical cation state deteriorates when the compound has an absorption peak in the wavelength region of a light emitted from an emission layer.

Hereinafter, there is described an experiment for verifying that the material deterioration is caused by the excitation of a radical cation.

(1) Production of Sample for Verification Experiment

Indium tin oxide (ITO) was formed into a film having a thickness of 130 nm by a sputtering method to serve as an anode on a glass substrate as a substrate, and the resultant was used as a transparent, conductive supporting substrate. The resultant was subjected to ultrasonic cleaning in acetone and isopropyl alcohol (IPA) sequentially, and was then subjected to boiling cleaning in IPA, followed by drying. Further, the resultant was subjected to UV/ozone cleaning.

Next, a film was formed on the substrate by the simultaneous vacuum vapor deposition of Compound 1 shown below as a host material and Compound 2 shown below as a light emitting dopant from different boats. The layer had a concentration of Compound 2 of 10 wt % and a thickness of 100 nm. The layer is referred to as a first organic compound layer.

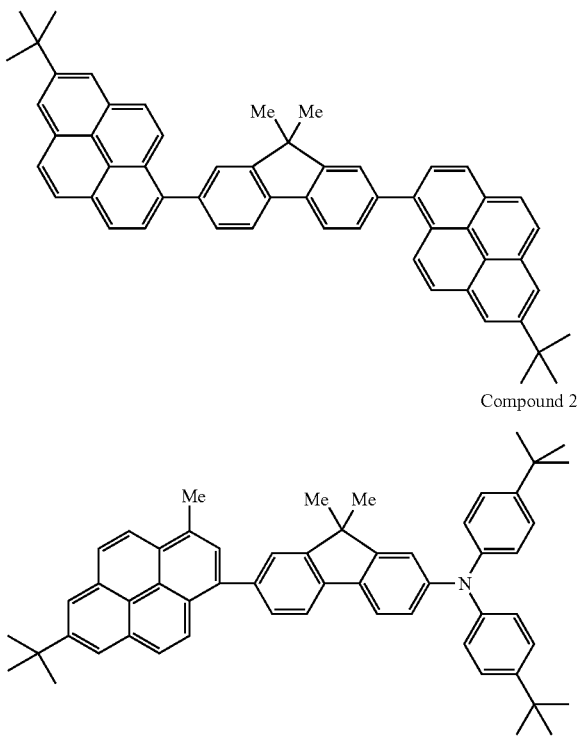

Compound 1

Compound 2

Next, the following Compound 3 was subjected to a vacuum vapor deposition to have a thickness of 15 nm. The thus obtained layer is referred to as a second organic compound layer.

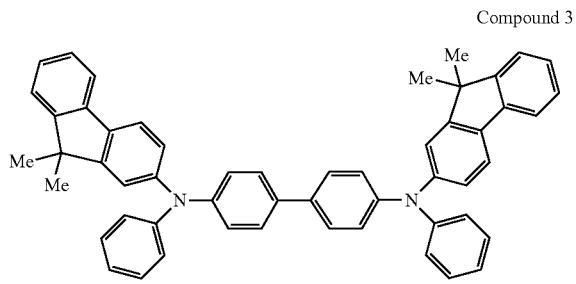 [SMILES: CC1(C)c2ccccc2-c2ccc(N(c3ccccc3)c3ccc(-c4ccc(N(c5ccccc5)c5ccc6c(c5)C(C)(C)c5ccccc5-6)cc4)cc3)cc21]

Compound 3

Further, an aluminum film having a thickness of 150 nm was provided by a vacuum vapor deposition to produce a sample as an electron injection electrode (cathode).

The obtained sample was covered with a protective glass plate under an atmosphere of nitrogen at a dew point of −70° C. or lower so as to avoid adsorption of moisture and sealed with an epoxy-based adhesive. An excavation was provided on the adhesive surface side of the protective glass and a sheet for absorbing moisture (moisture getter sheet for organic EL manufactured by Dynic Corporation) was sealed therein.

(2) Detail of Verification Experiment

A voltage was applied to the thus obtained sample by using an ITO electrode (anode) as a positive electrode and an aluminum electrode (cathode) as a negative electrode. Because the electron affinity of Compound 3 is small, the electron injection from Al to the organic compound layer does not occur but the hole injection from the ITO electrode to the organic compound layer occurs. Therefore, only the hole current is current-conducted in the sample. Accordingly, the sample does not emit electrolumiscence even with the current conduction.

A voltage was applied to the sample (sample 1) while a current density was kept at 100 mA/cm$^2$. The voltage was about 21 V at the start time of the current conduction and about 22 V after 130 hours from the current conduction, and thus, the voltage hardly increased. In addition, when the photoluminescence of the first organic compound layer was measured, the intensity was maintained at about 99% after 130 hours from the current conduction with respect to the intensity before the current conduction. It is indicated that, although Compound 1 and Compound 2 repeatedly underwent oxidation (radical cationization) and neutralization due to the hole transport, Compound 1 and Compound 2 hardly deteriorated.

Next, a sample (sample 2) which was produced in exactly the same way was irradiated with a light at 460 nm from a glass substrate side for 130 hours. The irradiation intensity was about 0.4 W/cm$^2$.

Both electrodes were in the sate where the voltage was maintained at 0 V and there was no current conduction.

When the photoluminescence of the first organic compound layer of the sample was measured, the intensity of the photoluminescence was maintained at 99% after 130 hours from the irradiation with respect to that before the irradiation. It indicates that, because an energy gap between Compound 1 and Compound 2 is a wavelength shorter than 460 nm (high energy), the excitation did not occur with the wavelength and the deterioration hardly occurred.

Next, a sample (sample 3) synthesized in exactly the same way was irradiated with a light at 460 nm all the time while the current density was kept at 100 mA/cm$^2$ and a voltage was applied to the sample 3. The voltage was about 21 V at the start time of the current conduction and the light irradiation, but after 130 hours from the current conduction and the light irradiation, the voltage was increased remarkably to as large as 35 V. In addition, when the photoluminescence of the first organic compound layer was measured, the intensity after 130 hours from the current conduction and the light irradiation showed definite deterioration, i.e. about 92% with respect to the intensity at the beginning.

From those experimental results, the radical cation of Compound 2, which was generated by the hole transport, may deteriorate by being excited with an irradiation light at 460 nm. Because, as described above, Compound 2 in the neutral state cannot excite at 460 nm due to a wide energy gap, but Compound 2 in a radical cation state has a light absorbed in the wavelength region to thereby excite. Here, the reason why attention is paid on Compound 2 is that Compound 2 has a smaller ionization potential than that of Compound 1, and Compound 2 preferentially becomes the radical cation state due to the hole transport.

FIG. 1 illustrates optical absorption spectra of Compound 2 in the neutral state and the radical cation state. As illustrated in FIG. 1, when Compound 2 becomes the radical cation state, it is revealed that Compound 2 has a new absorption peak at the vicinity of 460 nm, which does not appear at the neutral state.

From a series of the verification experiments above, it was revealed that the radical cation generated by the hole transport underwent the excited state, and hence, the material deteriorated.

The inventors of the present invention further noticed the essence thereof. That is, the radical cation was excited and deteriorated by the irradiation light from outside of the device in the case of the verification experiment above, but in an actual organic light emitting device, the radical cation may be excited and deteriorated by emission of the light emitting material generated in the emission layer. However, the inventors considered that it was not main cause of the deterioration and the radical cation was excited and deteriorated by the transfer of energy from the light emitting material at excited state to the radical cation.

It is because the inventors considered that the fact that an energy transfers from the light emitting material at excited state to the radical cation may be more efficient and dominant than the fact that the radical cation absorbs the emission from the light emitting material (emission-reabsorption). The energy transfer also occurs through the absorption of the radical cation as in the case of the emission-reabsorption.

In particular, Foerster-type energy transfer from singlet excited state where there is high energy may be important, because higher energy of the radical cation at excited state is unstable and the material deterioration tends to occur.

As described above, the inventors of the present invention discovered that the excited state of the radical cation generated by the energy transfer from the exciton (excited state) to hole (radical cation state) was a route of deterioration. The present invention suppresses the route of deterioration effectively by controlling the materials constituting the emission layer, to thereby enable improvement in the driving lifetime. In particular, when the energy of the radical cation at excited state is high, the deterioration may be remarkable. The deterioration causes a problem particularly in the case of a blue light emitting device. Therefore, the present invention is effective particularly in the case of a blue light emitting device.

The blue light emission in the present invention refers to emission which shows xy chromaticity coordinate in the range of blue in the chromaticity segment of JIS standard (JIS Z8110).

Note that, the emission spectrum in the present invention is obtained, as described later, by forming, on the glass substrate directly, a thin film having the same constitution as in the emission layer and measuring the photoluminescence of the sample.

In the present invention, attention is paid on a radical cation sate of a material having the smallest ionization potential in the emission layer, because the hole injected in the emission layer electrify a material having the smallest ionization potential at high probability.

In the organic light emitting device of the present invention, the absorption spectrum in a radical cation state of the material having the smallest ionization potential in the emission layer does not have absorption peak in an emission wavelength region of the light emitting material.

As a result, in the present invention, the deterioration may be prevented by suppressing the energy transfer from the light emitting material at excited state to the radical cation of the material having the smallest ionization potential.

The fact that the absorption spectrum has an absorption peak means that the excited state of the radical cation (ground state is regarded as zero energy) is present in the energy corresponding to the absorption peak. In the case where the absorption spectrum has an absorption peak, the energy transfer from the light emitting material to the radical cation occurs smoothly.

Note that the emission wavelength region in the present invention is a wavelength range where the emission spectrum of a light emitted in the emission layer has a value equal to or larger than the half of the emission peak.

The absorption peak in the present invention may be any one of peaks which indicate clearly with the wave pattern of the absorption spectrum that the excited state of the radical cation is present in the center of the energy thereof (the ground state is regarded as zero energy). The specific shape of the absorption peak is not limited and refers to a convex form having a height equal to or larger than that of a measurement noise level. The measurement noise level is determined by the measurement conditions and the performance limit of an apparatus. Whether a wave is a measurement noise or not can be judged by, for example, reproducibility when spectra are measured multiple times.

In addition, a radical cation absorption amount is preferably small in the emission wavelength region.

Figure 10:
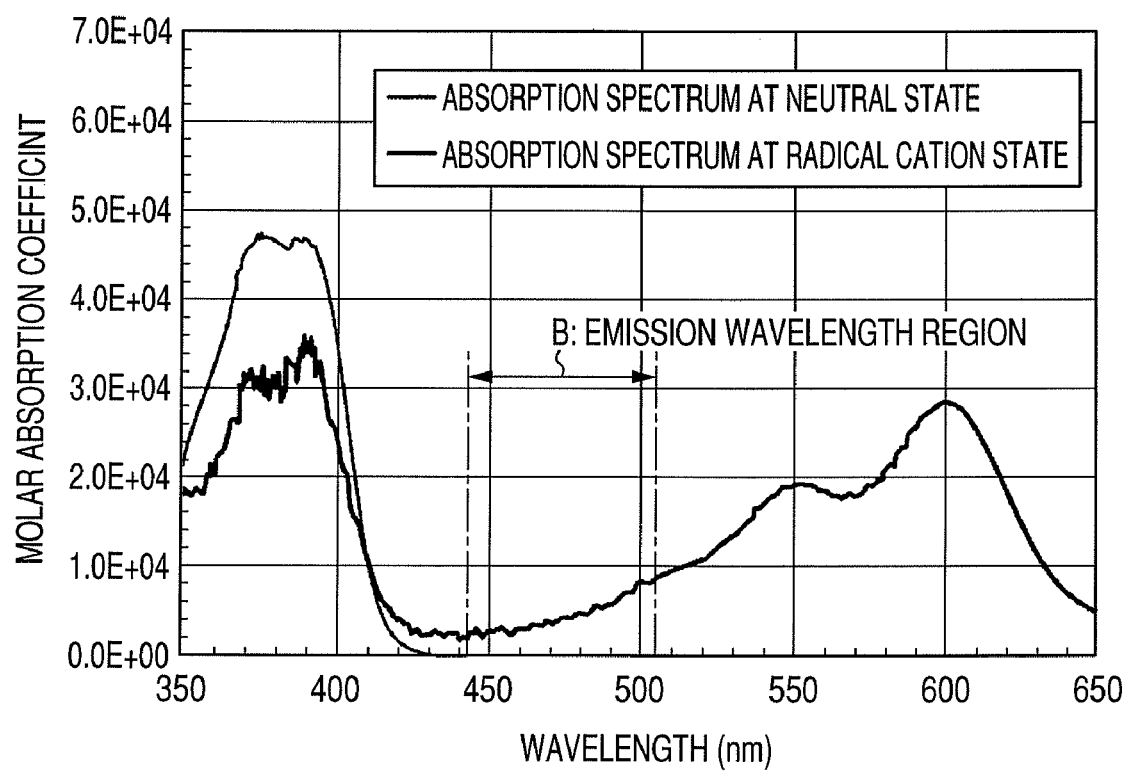
FIG. 10 illustrates absorption spectra of Compound 6 in the neutral state and in a radical cation state.
Figure 11:
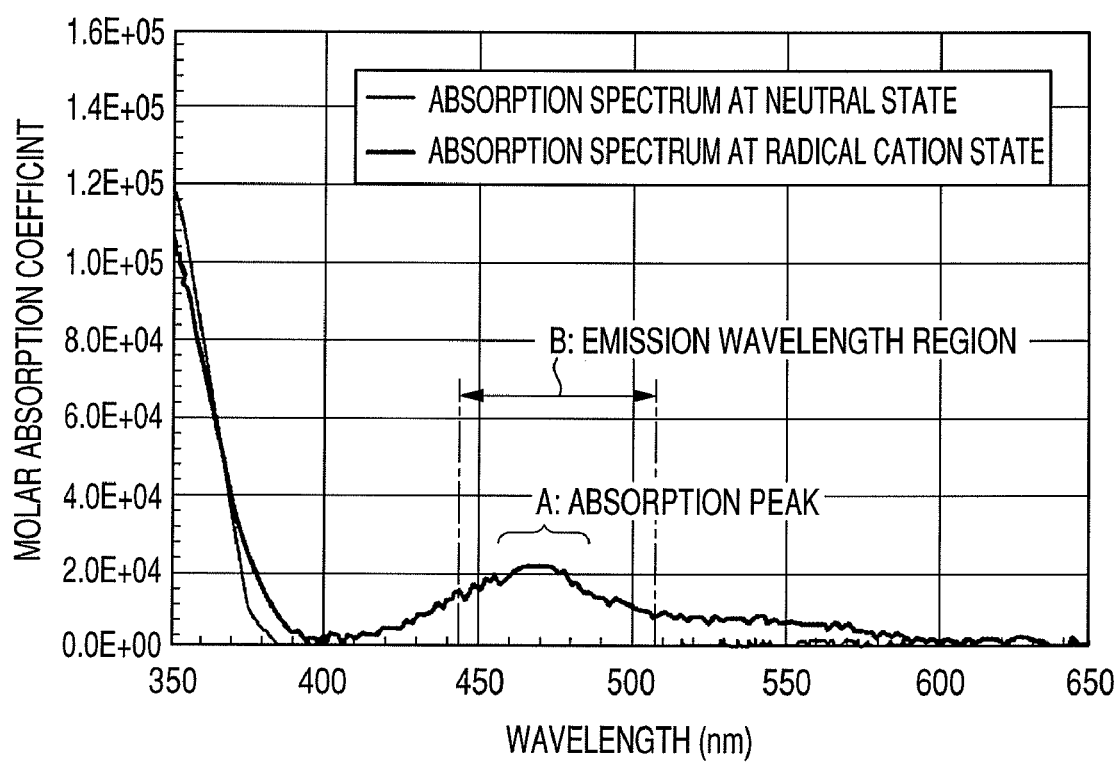
FIG. 11 illustrates absorption spectra of Compound 10 in the neutral state and in the radical cation state.

More specifically, the experiment carried out by the inventors of the present invention revealed that the absorption amount of the radical cation was preferably 1.0E+04 (ten thousand order) or less and equal to or larger than the measurement noise level in terms of molar absorption coefficient (examples are given in FIG. 10 and FIG. 11 described later). Note that the unit of the molar absorption coefficient is (L/(mol·cm)). Accordingly, the preferable absorption amount of the radical cation can be expressed, by attaching a unit, as 10,000 L/(mol·cm) or less.

The light emitting material in the present invention refers to a material emitting a light that one wants to intake as an organic light emitting device. Accordingly, in the case where the emission layer is formed of the constitution as above, i.e. a host and a luminescent dopant, the light emitting material refers to the luminescent dopant.

In the description of the verification experiment described above, the light emitting material is a fluorescence light emitting material, but the present invention has the same effect even with a phosphorescence light emitting material.

The phosphorescence light emitting material is a material using emission from lowest triplet excited state (T1). Originally, T1 is optically inactive because spin is forbidden, but the phosphorescence light emitting material has a heavy atom in its molecule to thereby release the forbidden spin and enable the emission from T1 at room temperature. In this case, attention is paid on the energy transfer from the phosphorescence light emitting material at the T1 state to the radical cation of the material having the smallest ionization potential. In addition, it is demanded that there is no absorption peak of the material having the smallest ionization potential in a radical cation state in a phosphorescence emitting wavelength region.

In the present invention, suitable phosphorescence light emitting materials are metal complexes such as an iridium complex, a platinum complex, a ruthenium complex, and osmium complex. More preferred is the iridium complex that is known to have strong phosphorescence emitting performance.

In the present invention, the emission layer that the organic light emitting device has is not only formed of a material having the smallest ionization potential and a light emitting material but also may be formed of those materials and another material.

Alternatively, in the present invention, the emission layer, which the organic light emitting device has, may be formed of a single material. In this case, the material having the smallest ionization potential and the light emitting material are the same compounds.

As described above, the organic light emitting device of the present invention can suppress the energy transfer from the light emitting material at excited state to the radical cation, whereby an organic light emitting device having a long continuous driving lifetime can be provided.

In addition, in order to suppress the route of deterioration, the density (hole density) of the material in a radical cation state in the emission layer is preferably low.

Because, in particular, the hole is easily trapped in the material having the smallest ionization potential, the density of the material in the emission layer is preferably 20 wt % or more. If the density is 20 wt % or more, the hopping conduction of the hole between the materials is remarkable, resulting in reduction of trapping performance.

In addition, in order to concentrate the hole transport on the material with hole transport on another material (that is, without setting another material in radical cation state) as less as possible, the concentration is preferably 20 wt % or more.

Note that the maximum value of the concentration of the material having the smallest ionization potential in the emission layer is 100%. This holds true for the case where the above emission layer is formed of a single material.

In the present invention, the fact that the hole trapping performance impairs when the concentration of the material having the smallest ionization potential is 20 wt % or more in the emission layer, can be also described based on the following phenomenon.

Figure 2:
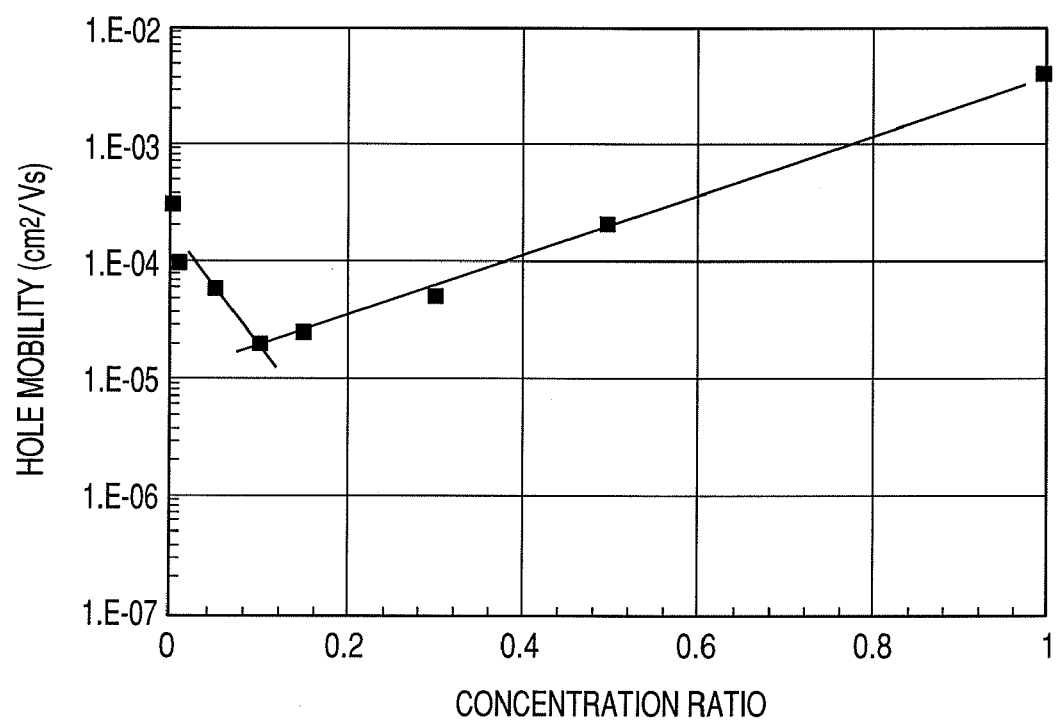
FIG. 2 is a graph illustrating results of hole mobility of a mixed film of Compound 4 and Compound 5.

FIG. 2 illustrates the results of hole mobility of a mixed film formed of the following Compound 4 and the following Compound 5 measured by the Time-of-Flight (TOF) method.

Compound 4

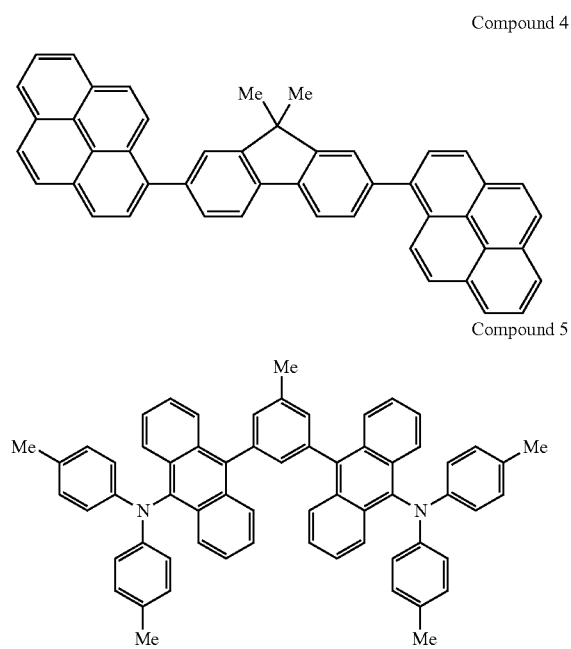

Compound 5

Note that a TOF measurement apparatus (TOF-301 manufactured by Optel Corporation) was used in the measurement. As a sample for the measurement, used was a sample obtained by forming a mixed thin film formed of Compounds 4 and 5 on a glass substrate equipped with ITO by a vacuum vapor deposition to have a thickness of 2 μm to 4 μm, and depositing, as a counter electrode, aluminum from vapor on the thin film.

The abscissa axis represents the concentration of Compound 5 in the mixed film, and the ordinate axis represents a hole mobility at an electric field intensity of 36 kV/cm. The ionization potentials of Compound 4 and Compound 5 are 5.70 eV and 5.49 eV, respectively. The hole mobility is slowest at a concentration of 10 wt %, and thus, Compound 5 is revealed to function as a hole trap strongly. When the concentration is 20% or more, the hole mobility increases about twice or more the hole mobility at a concentration of 10%, and the hole strapping performance is revealed to decline.

Further, the hole mobility for the case where the concentration is less than 10% is measured in three points in FIG. 2. The hole mobility in those three points is higher than not only the hole mobility at a concentration of 10% but also at a concentration of 20%. However, as described above, the concentration of less than 10% is not preferred in view of the concentration of the hole transport on the material having the smallest ionization potential.

Thus, dopant concentration even in the general emission layer is preferably 20% or more. Therefore, in the present invention as well, the concentration of the material having the smallest ionization potential is also preferably 20% or more for decreasing the hole density.

In addition, in order to decrease the hole density in the emission layer, the concentration of the material having the smallest ionization potential may be set to 20% or more, and in addition, the electron density in the emission layer may be set to be high. If the electron density is set to be high, a recombination probability is increased, with the result that the hole density can be decreased. For such a purpose, a dopant material that traps electron may be mixed in the emission layer. As a result, the electron can be accumulated. The dopant material herein may be the same material as the light emitting material, or may be different from the light emitting material and the material having the smallest ionization potential.

According to the study of the inventors of the present invention, if the electron affinity of the dopant material EAD has the following relationship with the electron affinity of the host material (for example, a material having the smallest ionization potential) EAH, the electron-trapping performance becomes remarkable.

$$EAD-EAH \geq 0.15 \text{ eV}$$

Figure 3:
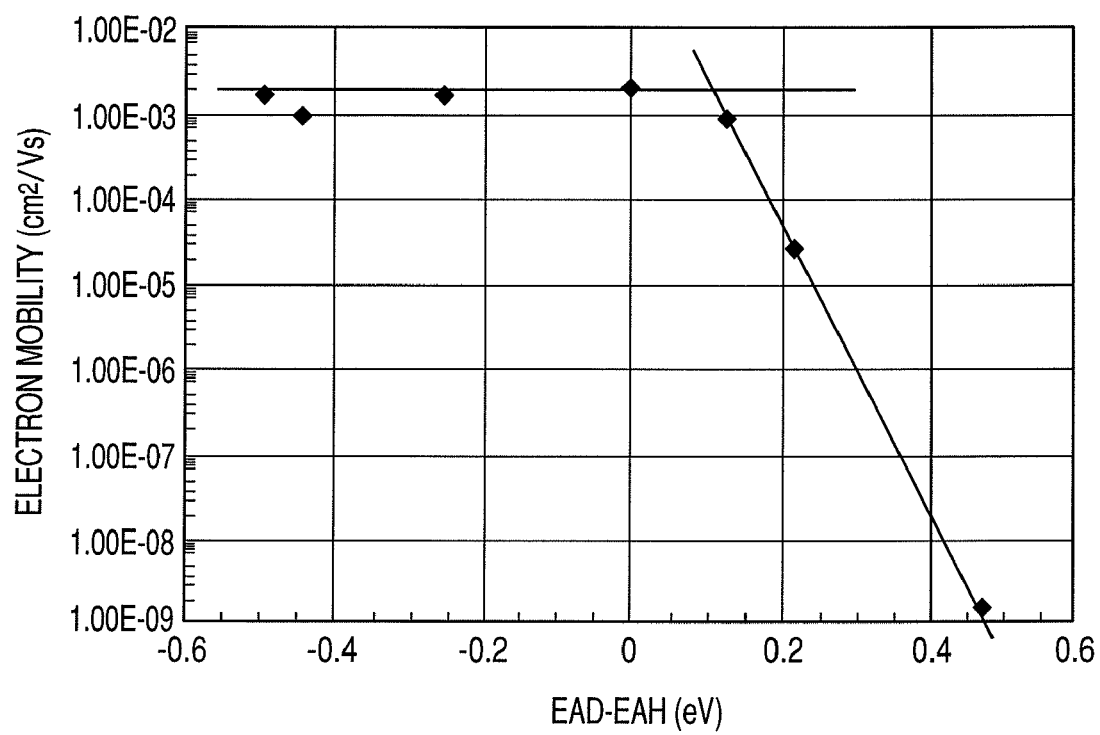
FIG. 3 is a graph illustrating the results of electron mobility of a film obtained by mixing dopants having different electron affinity.

FIG. 3 illustrates the measurement results of electron mobility of samples by a TOF method, the sample being obtained by using Compound 4 as a host and mixing various materials, as dopants, having different electron affinities at a concentration of 10 wt %. The abscissa axis represents a difference of electron affinity between the dopant and Compound 4 (EAD-EAH), and the ordinate axis represents an electron mobility at an electric field intensity of 36 kV/cm. Note that a plot representing EAD−EAH=0 shows the electron mobility of a single host. The electron mobility is revealed to decrease remarkably (⅕ or less) in the case where the difference in the electron affinity is 0.15 eV or more, that is, it is revealed that the electron-trapping performance functions.

As the dopant having functional electron-trapping performance and large electron affinity, a material having, as a skeleton, an aromatic hydrocarbon containing a 5-membered ring is preferred. In addition, in order to realize a blue light emission, preferred is a material having, as a skeleton, any one of fluoranthene, benzo[k]fluoranthene, benzo[ghi]fluoranthene, and benzo[b]fluoranthene.

In the present invention, the moisture concentration in the emission layer is preferably low enough to obtain the sufficient effect of suppressing the deterioration. If the contained moisture concentration is high, materials in the emission layer is hydroxylated and a deteriorated product having small ionization potential may be produced.

In order to lower the moisture concentration in the emission layer sufficiently, for example, a dew point in the case of sealing an organic light emitting device with a sealing agent or a sealing member is preferably −110° C. or higher and −70° C. or lower.

In addition, in order to lower the moisture concentration in the emission layer sufficiently, for example, a vacuum degree in the case where an organic compound layer is formed by a vapor deposition is preferably $10^{-7}$ Pa or more to $10^{-4}$ Pa or less.

If the deteriorated product is generated, hole may accumulate in the deteriorated product at high probability, and the effect of suppressing the deterioration in the present invention may be lowered.

In the case where an emission layer is formed by a vacuum vapor deposition, the vacuum degree is preferably set within the above range in order to lower the contained moisture concentration, and in addition, the deposition rate of the organic compound is preferably set to be high. The deposition rate is more preferably 0.5 nm/sec or more to 10 nm/sec or less. In addition, in order to decrease the amount of moisture adsorption to interfaces at an anode side and a cathode side in the emission layer, a non-deposition waiting time before and after the vapor deposition of the emission layer is desired to be short (more preferably 10 minutes or shorter). In addition, it is preferred that the vacuum state be not broken in the non-deposition waiting time between the step before the vapor deposition of the emission layer and the vapor deposition step of the emission layer. Alternatively, it is preferred that the vacuum state be not broken in the non-deposition waiting time between the vapor deposition step of the emission layer and the step after the vapor deposition of the emission layer. Further, it is more preferred the vacuum state be not broken in any non-deposition waiting time.

In addition, in the present invention, it is preferred that the purity of a material to be used be particularly high in order to obtain the effect of suppressing the deterioration sufficiently. In particular, in the case where an impurity having a small ionization potential is contained, hole may be trapped in the impurity at high probability and the effect of suppressing the deterioration in the present invention impairs.

FIG. 4 to FIG. 7 illustrate constitution examples of the organic light emitting device of the present invention.

The numeral symbols in those figures are described. An organic light emitting device includes a substrate 1, an anode 2, an emission layer 3, a cathode 4, a hole transport layer 5, an electron transport layer 6, and may include a hole injection layer 7, and a hole block layer 8.

In addition, a display apparatus includes a TFT driving circuit 10, a planarization film 11, a pixel isolation film 12, a reflective film 13, a transparent electrode 14, an auxiliary electrode 15, a protective glass 16, a getter sheet 17, a circularly polarizing plate 18, a blue emission layer 31, a green emission layer 32, a red emission layer 33, and a second hole transport layer 51.

Figure 4:
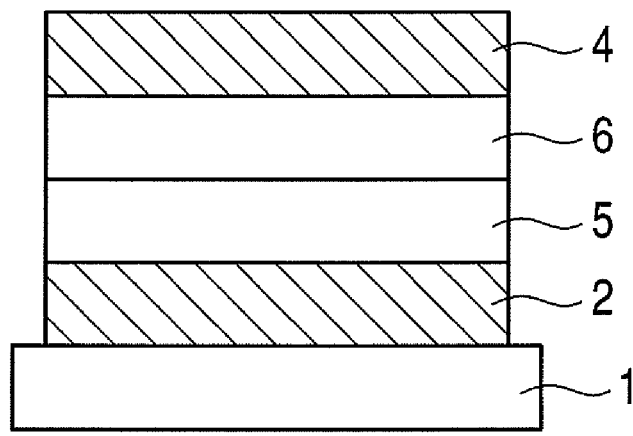
FIG. 4 is a sectional view illustrating an example of an organic light emitting device of the present invention.

FIG. 4 shows a constitution obtained by sequentially providing, on a substrate 1, an anode 2, a hole transport layer 5, an electron transport layer 6, and a cathode 4. In this case, at least one of the hole transport layer and the electron transport layer also serves as an emission layer.

Figure 5:
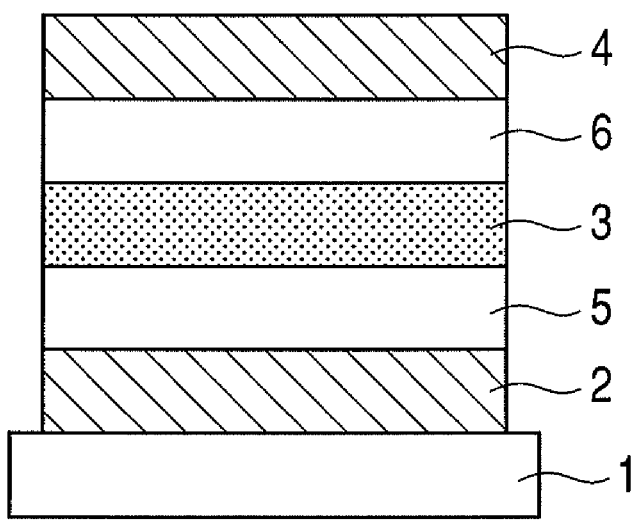
FIG. 5 is a sectional view illustrating an example of an organic light emitting device of the present invention.

FIG. 5 shows a constitution obtained by sequentially providing, on the substrate 1, the anode 2, the hole transport layer 5, an emission layer 3, the electron transport layer 6, and the cathode 4. In this constitution, a carrier transport function and a light emitting function are separated from each other, and a region in which a hole and an electron recombine with each other is present in the emission layer. The constitution is used in combination with compounds having respective properties, that is, hole transport property, electron transport property, and light emitting property at the proper time, so the degree of freedom in the selection of materials extremely increases. In addition, the variety of emission hues can be increased because various compounds different from each other in emission wavelength can be used. Further, light emitting efficiency can be improved by effectively trapping each carrier or each exciton in the emission layer 3 as a central layer.

Figure 6:
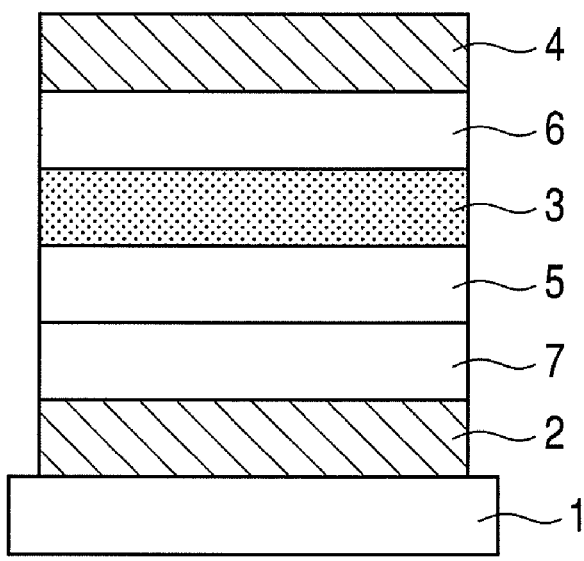
FIG. 6 is a sectional view illustrating an example of the organic light emitting device of the present invention.

FIG. 6 shows a constitution illustrated in FIG. 5 except that a hole injection layer 7 as one kind of a hole transport layer is inserted on a side of the anode 2. The layer has an improving effect on adhesiveness between the anode 2 and the hole transport layer 5 or on hole injection property, and is effective for a reduction in voltage at which the device is driven.

Figure 7:
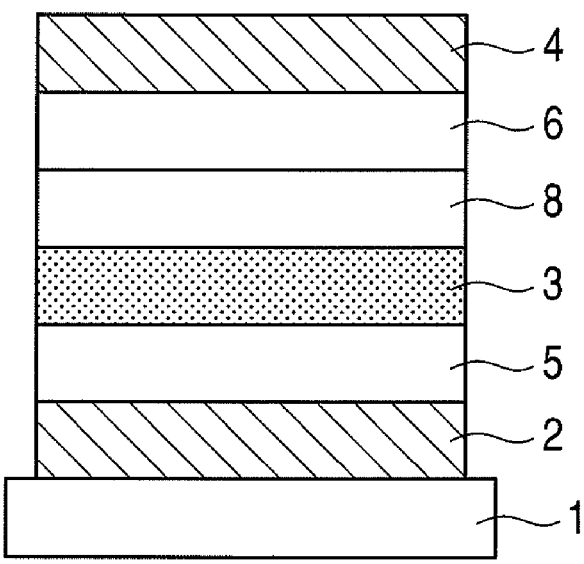
FIG. 7 is a sectional view illustrating an example of the organic light emitting device of the present invention.

FIG. 7 shows a constitution illustrated in FIG. 5 except that a hole block layer 8 as one kind of an electron transport layer is inserted into a gap between the emission layer 3 and the electron transport layer 6. The constitution includes a compound having a large ionization potential (that is, a low HOMO energy) in the hole block layer 8 to alleviate the leak of a hole from the emission layer toward a cathode side, and is effective for an improvement in light emitting efficiency.

In the case where the device constitution includes a hole transport layer, an emission layer, and an electron transport layer, a recombination region is preferably located at the electron transport layer side in the emission layer. Because, in general, a material having relatively small ionization potential is used as the hole transport layer, an energy gap between the hole transport layer and the emission layer is frequently generated in the hole injection. Therefore, hole accumulates at the interface of the emission layer side in the hole transport layer, and a radical cation of a hole transport material is generated. In the case where the recombination amount at the hole transport layer side is much in the emission layer, the radical cation of a hole transport material is excited by energy transfer from the emission layer and the device may deteriorate.

A plurality of emission layers may be provided. In particular, a plurality of emission layers of different emission colors are provided, and thus, white light can be also obtained. In this case, as a constitution for obtaining the white light, preferred are combinations such as two layers of a blue emission layer and an yellow emission layer and three layers of a blue emission layer, a green emission layer, and a red emission layer. In the case of the above device constitution, in at least one of emission layers, the deterioration may be suppressed based on the operating principle of the present invention.

An energy gap can be determined from a visible light-ultraviolet absorption spectrum. In the present invention, the energy gap was determined from an absorption edge of a thin film formed on a glass substrate by using a spectrophotometer U-3010 manufactured by Hitachi, Ltd. as equipment.

An ionization potential and a highest occupied molecular orbital (HOMO) energy were measured by employing photoelectron spectroscopy in the air (measuring instrument name AC-1 manufactured by RIKENKIKI CO., LTD.).

An electron affinity and a lowest unoccupied molecular orbital (LUMO) energy can be calculated from the measured value for the energy gap and the above-mentioned ionization potential. That is, electron affinity=ionization potential−energy gap.

The emission spectrum of the light emitting material was obtained by measuring photoluminescence with a spectrofluorometer F4500 manufactured by Hitachi Ltd. In the present invention, a sample obtained by forming, on a glass substrate, a thin film having the same constitution as the emission layer was used.

The absorption spectrum of the radical cation is obtained by applying an electric potential to an electrolyte solution with a potentiostat to generate an oxidation state (radical cation) and measuring the absorption spectrum thereof. In the present invention, an electric potential equal to about oxidation potential is applied to a target electrolyte solution having a material concentration of $1\times10^{-2}$ to $10^{-5}$ mol/l and change of the absorption spectrum with time is measured.

The absorption spectrum is a sum of the absorption spectrum of molecules in the neutral state and the absorption spectrum of molecules in a radical cation state, and the production amount of the radical cation can be estimated from a current conduction charge amount (amperometry). The absorption spectrum of the radical cation itself can be obtained from an abundance ratio of the neutral molecules and the radical cation, and the absorption spectrum at that time. A charge chemical analyzer (potentiostat) used herein is 660C manufactured by ALS. As a light source in the measurement of the absorption spectrum, a deuterium tungsten halogen light source DH-2000 (manufactured by Ocean Optics, Inc.) was used. In addition, as a spectrometer, USB-2000 manufactured by Ocean Optics, Inc. was used.

A hole transporting material preferably has excellent mobility with which the injection of a hole from an anode is facilitated and with which the injected hole is transported to an emission layer. Examples of low-molecular-weight- and high-molecular-weight-based materials each having hole injection/transport performance include, but of course not limited to, a triarylamine derivative, a phenylenediamine derivative, a triazole derivative, an oxadiazole derivative, an imidazole derivative, a pyrazoline derivative, a pyrazolone derivative, an oxazole derivative, a fluorenone derivative, a hydrazone derivative, a stilbene derivative, a phthalocyanine derivative, a porphyrin derivative, poly(vinylcarbazole), poly(silylene), poly(thiophene), and any other conductive polymer.

An electron injecting/transporting material can be arbitrarily selected from materials each having a function with which the injection of an electron from a cathode is facilitated and with which the injected electron is transported to the emission layer, and is selected in consideration of, for example, a balance between the carrier mobility of the material and the carrier mobility of a hole transport material. Examples of a material having electron injection/transport performance include, but of course not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex. In addition, a material having a large ionization potential can be used also as a hole block material.

A layer composed of an organic compound of the organic light emitting device of the present invention is obtained in an emission layer or other organic layers by any one of various methods. In general, a thin film is formed by vacuum vapor deposition, ionized vapor deposition, sputtering, or plasma CVD. Alternatively, a thin film is formed by: dissolving a material for the film in an appropriate solvent; and applying the solution by a known application method (such as spin coating, dipping, a cast method, an LB method, or an ink-jet method). In particular, when a film is formed by an application method, the film can be formed in combination with an appropriate binder resin.

The above-mentioned binder resin can be selected from a wide variety of binding resins, and examples of the binder resin include, but not limited to, a polyvinyl carbazole resin, a polycarbonate resin, a polyester resin, a polyallylate resin, a polystyrene resin, an ABS resin, a polybutadiene resin, a polyurethane resin, an acrylic resin, a methacrylic resin, a butyral resin, a polyvinyl acetal resin, a polyamide resin, a polyimide resin, a polyethylene resin, a polyether sulfone resin, a diallyl phthalate resin, a phenol resin, an epoxy resin, a silicone resin, a polysulfone resin, and a urea resin. In addition, one kind of them may be used alone, or two or more kinds of them may be mixed to serve as a copolymer. Further, as required, a known additive such as a plasticizer, an antioxidant, or a UV absorber may be used in combination with the binder resin.

A material for the anode desirably has as large a work function as possible, and examples of the material that can be used include: metal elements such as gold, platinum, silver, copper, nickel, palladium, cobalt, selenium, vanadium, and tungsten, or alloys of the metal elements; and metal oxides such as tin oxide, zinc oxide, indium oxide, indium tin oxide (ITO), and indium zinc oxide. A conductive polymer such as polyaniline, polypyrrole, polythiophene, or polyphenylene sulfide can also be used. Each of those electrode substances can be used alone, or two or More of them can be used in combination. In addition, the anode may be constituted of a single layer, or may be constituted of multiple layers.

On the other hand, a material for the cathode desirably has as small a work function as possible, and examples of a material that can be used include: metal elements such as lithium, sodium, potassium, calcium, magnesium, aluminum, indium, ruthenium, titanium, manganese, yttrium, silver, lead, tin, and chromium; and alloys each composed of two or more of the metal elements such as a lithium-indium alloy, a sodium-potassium alloy, a magnesium-silver alloy, an aluminum-lithium alloy, an aluminum-magnesium alloy, and a magnesium-indium alloy. A metal oxide such as indium tin oxide (ITO) can also be used. Each of those electrode substances can be used alone, or two or more of them can be used in combination. In addition, the cathode may be constituted of a single layer, or may be constituted of multiple layers.

In addition, at least one of the anode and the cathode is desirably transparent or semi-transparent.

A substrate to be used in the present invention is not particularly limited; an opaque substrate such as a metallic substrate or a ceramic substrate, or a transparent substrate such as glass, quartz, or a plastic sheet is used. In addition, a color filter film, a fluorescent color conversion filter film, a dielectric reflective film, or the like can be used in the substrate to control colored light.

In addition, with regard to the direction in which light is extracted from the device, both a bottom emission constitution (constitution in which light is extracted from a substrate side) and a top emission constitution (constitution in which light is extracted from the side opposite to the substrate) are possible.

It should be noted that the produced device may be provided with a protective layer or a sealing layer for the purpose of preventing the device from contacting with, for example, oxygen or moisture. Examples of the protective layer include: a diamond thin film; an inorganic material film made of, for example, a metal oxide or a metal nitride; a polymer film such as a fluorine resin, polyparaxylene, polyethylene, a silicone resin, or a polystyrene resin; and a photocurable resin. In addition, the device itself can be covered with glass, a gas impermeable film, a metal, or the like, and the device itself can be packaged with an appropriate sealing resin.

The organic light emitting device of the present invention can be mounted on various kinds of products.

For example, there can be provided an electrographic image-forming apparatus including a light source (exposure unit) having the organic light emitting device.

In addition, by arraying a plurality of the organic light emitting devices of the present invention two-dimensionally, a display portion can be constituted. Therefore, there can be provided an image display apparatus having the display portion.

The image display apparatus has at least the display portion and a driving portion which drives the display portion.

The image display apparatus is, for example, a display of a personal computer and a display of a television.

The driving portion preferably has, for example, in order to adjust brightness of the display image, a switch for adjusting the emission period of the organic light emitting device in one frame period.

In addition, the display portion can be used as an operating portion of a touch panel of an electrophotographic image-forming apparatus or the like.

Alternatively, there can be provided cameras (imaging apparatuses) such as a digital still camera or a digital video camera using the image display apparatus as an image display portion.

The display portion may have a switching device in each organic light emitting device. The switching device is TFT, for example.

Each organic light emitting device constituting the display portion may emit different colors from each other. More specifically, each organic light emitting device may emit any one of three colors, i.e. red, green, and blue. In this case, the image display apparatus enables full-color display.

In particular, in a full-color image display apparatus mounted on the above-mentioned mobile device, it is desired to efficiently utilize light emitted from an organic light emitting device in order to use limited power capacity effectively. Therefore, ejection efficiency is preferably increased by adjusting the optical interference distance of an organic light emitting device in each emission color. In particular, an optical distance between the emission region of the organic light emitting device and the reflecting surface of a reflective electrode is preferably ¼ times or ¾ times the emission wavelength.

In addition, in a full-color image display apparatus of multiple colors, a phosphorescent material can be used as a light emitting material of an organic light emitting device of any of the colors, because, by using the phosphorescent material as a light emitting material, an electric energy can be converted to a luminescent energy more efficiently. In particular, in a full-color display apparatus of three colors, that is, red, green, and blue, the phosphorescent material is preferably used as a light emitting material for only red, only green, or red and green.

Further, in view of suppressing waste energy consumption, the electric resistance in wiring parts is preferably smaller, and specifically, is preferably $0.1\Omega/\square$ to $50\Omega/\square$. In a constitution using a top emission-type organic light emitting device, an electric conductivity of a transparent or semi-transparent electrode (a counter electrode of an electrode at a substrate side) formed on an organic film tends to be low. In order to increase the electric conductivity, a material having high electric conductivity can also be provided to a part between a plurality of arranged organic light emitting devices. As a result, the resistance value at the electrode part can be decreased.

In addition, in the display region in an image display apparatus, an emission area ratio (aperture ratio) of the organic light emitting device is preferably 0.4 or more to 0.8 or less. This is because, if the aperture ratio is small, a current density current-conducted in the organic light emitting device at the time of obtaining the same luminance increases and load applied on the organic light emitting device becomes large. In addition, this is because, if the aperture is too large, the interval between light emitting devices are narrow and alignment of the light emitting devices at the time of forming a film becomes difficult.

Hereinafter, the present invention is described more specifically with reference to examples, but the present invention is not limited to the examples.

Synthesis Example 1

The following novel Compound 6 used in this synthesis example was synthesized by the method described below.

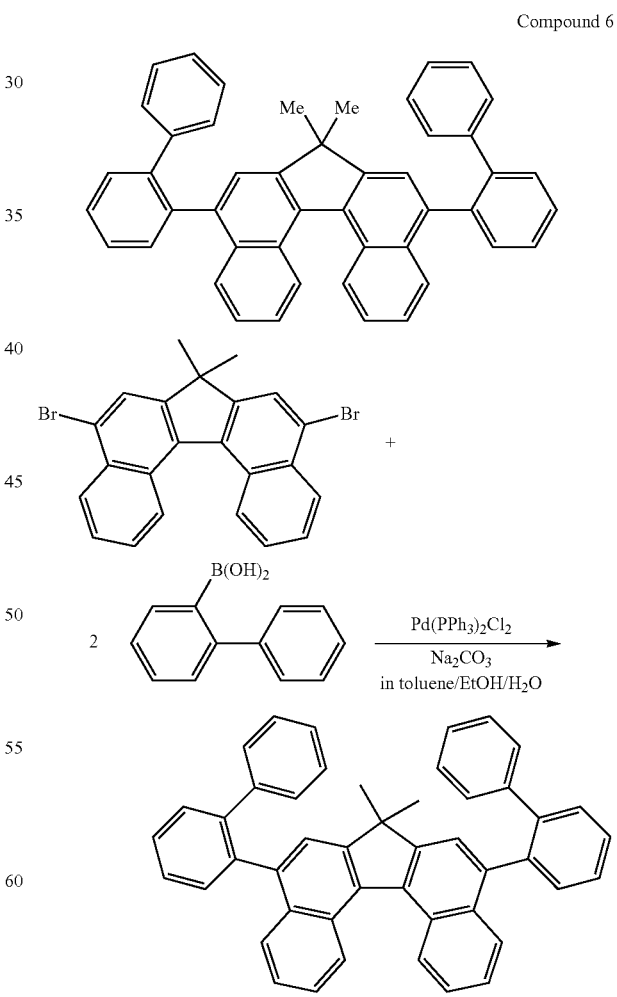

Under an atmosphere of nitrogen, the following reagents and solvents were loaded into a 100-mL egg-plant flask.
7,7-dimethyl-5,8-dibromobenzo[c,g]fluorene: 0.60 g (1.33 mmol)
2-biphenyl borate: 0.55 g (2.78 mmol)
Toluene: 20 mL
Ethanol: 10 mL Further, 10 mL of a 10 wt % aqueous solution of sodium carbonate were further added thereto and the reaction solution was stirred at room temperature for 30 minutes. Subsequently; 55 mg (0.078 mmol) of bis(triphenylphosphine)palladium (II) dichloride were added thereto, and the reaction solution was stirred under reflux by heating for 4 hours. After the completion of the reaction, an organic phase was extracted with toluene and washed with water. Then, the resultant was concentrated after drying on sodium sulfate, whereby a coarse body was obtained. The purification was performed with silica gel chromatography (heptane/toluene=4/1, mixed developing solvent). Further, slurry washing by heating with a heptane/toluene mixture solvent and slurry washing by heating with ethanol/chloroform mixture solvent were performed. In the slurry washing, a liquid is added to a solid, and the slurry (suspension) is heated to extract only impurity in the liquid, and the resultant is filtered after cooling, whereby a solid with high purity is obtained. Then, after the slurry washing by heating, the resultant was dried by heating under vacuum at 130° C., whereby 610 mg of Compound 6 was obtained (yield 77%). Further, Compound 6 was subjected to sublimation purification under the conditions of $10^{-4}$ Pa and 275° C., whereby 448 mg of a sublimation purification product at high purity (sublimation purification yield 73%) were obtained. Note that in this synthesis example, the compound subjected to sublimation purification was used.

The result obtained by identifying the obtained compound is shown below.
(MALDI-TOF-MS (Matrix-Assisted Laser Desorption/Ionization Time-of-Flight Mass Spectrometry))
Found: m/z=598.15, calcd: $C_{47}H_{34}$=598.27 ($^1$H-NMR (400 Hz, $CDCl_3$))
δ 8.69 (t, 2H), 7.90 (t, 2H), 7.65-7.45 (m, 10H), 7.42-7.38 (m, 2H), 7.22 (s, 1H), 7.16 (s, 1H), 7.11-6.95 (m, 10H), 1.35 (s, 1.5H), 1.06 (s, 3H), 0.87 (s, 1.5H)

The purity of the thus obtained Compound 6 was measured with a high-speed liquid chromatography (HPLC) manufactured by JASCO Corporation. It was revealed that the purity before the sublimation purification was 99.52% and the purity after the sublimation purification was 100%. The measurement conditions are as follows.
HPLC Analytical Condition
(Measurement apparatus) JASCO, UV-2075, wavelength=254 nm
(Sample) 1 mg/10 ml of THF
(Analytical column) YMC ODS•M80, S-4 μm, 4.6 mm×250 mm,
model number: JTO8S04-2546WT
(Setting of column temperature) 40° C.
(Loading amount) 1.0 μl
(Developing solvent) MeOH
(Flow rate) 1.0 ml/min
(Measurement time) 20 min
(Detection condition) UV absorption wavelength: 254 nm Synthesis Example 2

The following novel Compound 7 used in this synthesis examples was synthesized by a method as described below.

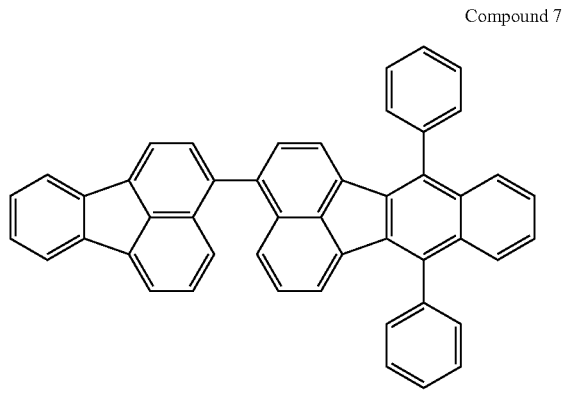 [SMILES: c1ccc(-c2c3c(c(-c4ccccc4)c4ccccc24)-c2ccc(-c4ccc5c6c(cccc46)-c4ccccc4-5)c4cccc-3c24)cc1]

Compound 7

(1) Synthesis of 4-bromo-7,12-diphenylbenzo[k]fluoranthene 200 ml of xylene were added to 5-bromoacenaphthylene (14.5 g, 62.8 mmol) and diphenylisobenzofuran (17.1 g, 63.3 mmol) and the mixture was stirred under reflux of xylene for 5 hours. After the mixture was cooled to room temperature, the solvent was distilled off. Then, 26 ml of trifluoroacetic anhydride and 260 ml of chloroform were added thereto, followed by stirring under reflux for 1 hour. After the mixture was cooled to room temperature, the solvent was distilled off. The obtained residue was purified by silica gel chromatography (mobile phase; toluene:heptane=1:3), whereby 16 g of 4-bromo-7,12-diphenylbenzo[k]fluoranthene were obtained as a yellow solid.

(2) Synthesis of Compound 7

Under an atmosphere of nitrogen, the following compounds were dissolved in a mixed solvent of toluene (100 ml) and ethanol (50 ml), and further, an aqueous solution obtained by dissolving 0.95 g (2.90 mmol) of cesium carbonate in 15 ml of distilled water was added thereto, followed by stirring at 50° C. for 30 minutes.
4-bromo-7,12-diphenylbenzo[k]fluoranthene (0.7 g, 1.45 mmol)
2-(fluoranthene-3-yl)-4,4,5,5-tetramethyl-[1,3,2]dioxaborolane (0.48 g, 1.45 mmol)
Then, tetrakis(triphenylphosphine)palladium (0.17 g, 0.145 mmol) was added thereto, and the resultant mixture was stirred under heating for 5 hours on a silicone oil bath heated to 90° C. After the mixture was cooled to room temperature, water, toluene, and ethyl acetate were added to the mixture. An organic layer was separated, and further, an aqueous layer was extracted (twice) with mixed solvent of toluene and ethyl acetate. The extracted product was added to the organic layer solution separated at first. The organic layer was washed with a saturated salt solution and then dried with sodium sulfate. The solvent was distilled off and the residue was purified by silica gel chromatography (mobile phase; toluene:heptane=1: 3). The resultant was dried under vacuum at 120° C. and subjected to sublimation purification, whereby 0.6 g of Compound 7 as a pale yellow solid was obtained.

Matrix-assisted laser desorption/ionization time-of-flight mass spectrometry (MALDI-TOF MS) confirmed that the compound had an M+ of 604.2.

Figure 8:
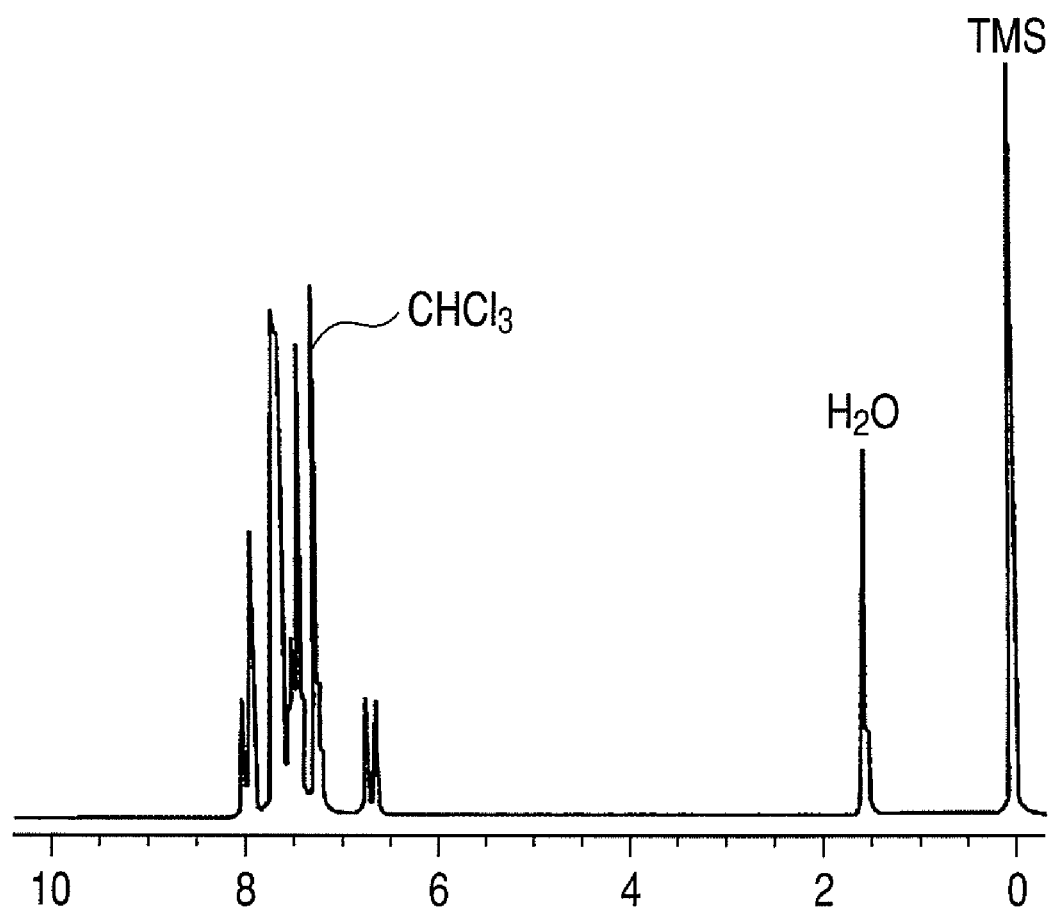
FIG. 8 is a view illustrating $^1$H-NMR ($CDCl_3$) spectrum of Compound 7.

In addition, the structure of the compound was identified by $^1$H-NMR measurement (FIG. 8). The identification result is as follows.

($^1$H-NMR (400 Hz, CDCl$_3$))
δ 8.01 (d, 1H), 7.91-7.95 (m, 3H), 7.58-7.71 (m, 13H), 7.39-7.54 (m, 8H), 7.22 (q, 1H), 6.74 (d, 1H), 6.63 (d, 1H)

The purity of the thus obtained Compound 7 was measured by using a high-speed liquid chromatography (HPLC) manufactured by JASCO Corporation, according to a sample concentration, an analytical column, and various kinds of measurement conditions shown below. As a result, with an UV and fluorescence detector, the purity in both cases was confirmed to be 99.9% or more.
(Sample) (Compound 7) 1 mg/10 g of THF
(Analytical column) YMC M80
(Setting of column temperature) 40° C.
(Loading amount) 5.0 μl
(Developing solvent) MeOH:CHCl$_3$=90:10
(Flow rate) 1.0 ml/min
(Measurement time) 20 min
(HPLC detection conditions)
UV absorption wavelength: 254 nm
Fluorescence excitation wavelength: 350 nm
Fluorescence detection wavelength: 450 nm Other Synthesis Examples and the Like Synthesis examples of Compounds 3, 8, and 9 used in Example 1 and Comparative Example 1 are shown below.

Synthesis Example of Compound 3

To a 100-ml egg-plant flask, loaded were 4.88 g (14.5 mmol) of N,N'-diphenylbenzidine, 6.40 g (20 mmol) of 2-iodo-9,9-dimethylfluorene, 4.00 g of potassium carbonate, 3.0 g of copper powder, and 30 ml of ortho-dichlorobenzene. A cooling pipe was provided to the flask, and the mixture was stirred continuously under reflux for 20 hours. After the reaction solution was cooled, the mixture was filtered and ortho-dichlorobenzene was removed by condensation under reduced pressure. Then, methanol was added thereto, and a crude crystal was deposited and collected by filtration.

The obtained crude crystal was purified with a toluene/hexane mixed solution by using a silica gel column, whereby 7.32 g (yield 70%) of Compound 3 as a white crystal were obtained.

Synthesis Example of Compound 8

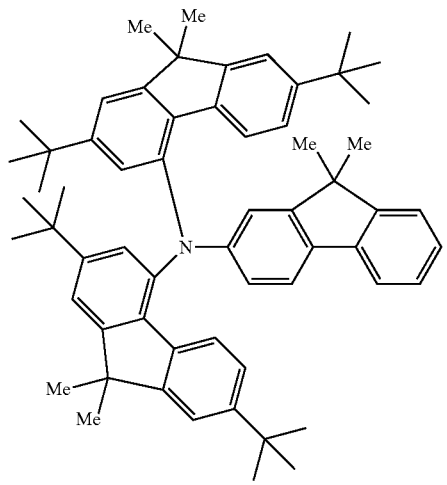

Compound 8

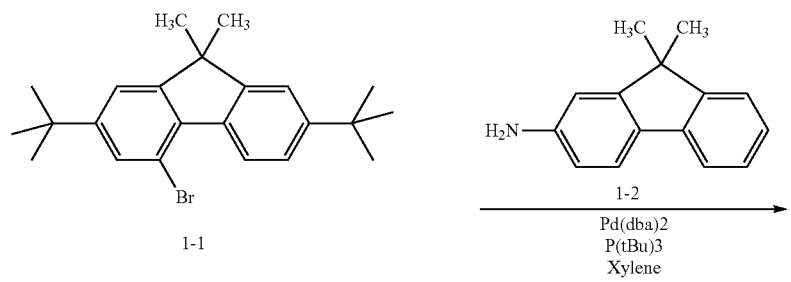

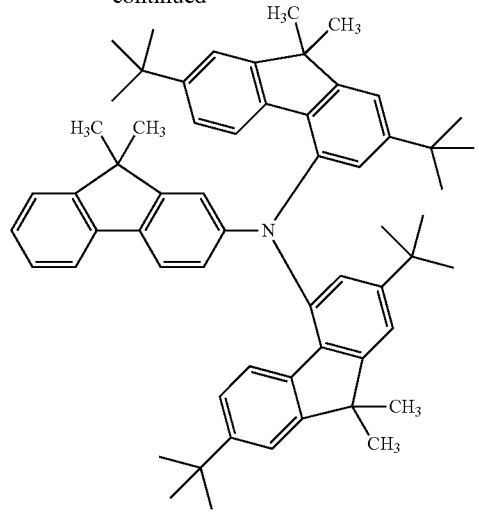

a) Synthesis of Intermediate Compound 1-1

An intermediate can be produced by using 2,7-di-tert-butyl fluorene (SIGMA-ALDRICH) as a raw material. Further, the intermediate is dimethylated, whereby Intermediate 1-1 can be obtained (Bull. Chem. Soc. Jpn., 59, 97-103(1986)).

b) Synthesis of Compound 8

A 200-ml three-necked flask was prepared. 4.56 g (12.0 mmol) of Compound 1-1 were put therein. In addition, 0.828 g (4.00 mmol) of Compound 1-2 and 0.96 g (10.0 mmol) of sodium tert-butoxide were further put therein. Further, 100 ml of xylene were put therein and the mixture was stirred at room temperature under an atmosphere of nitrogen. Then, 34.4 mg (0.17 mmol) of tri-tert-butyl phosphine were added thereto. Next, 48.9 mg (0.085 mmol) of palladium dibenzylidene acetone were added thereto. The temperature of the mixture was increased to 125° C. and stirred for 3 hours. After the reaction, an organic layer was extracted with toluene and dried with anhydrous sodium sulfate. Then, the extracted resultant was purified with a silica gel column (mixed developing solvent of heptane and toluene), whereby 2.53 g (yield 78.0%) of Compound 8 (white crystal) were obtained.

By a mass spectrometry, 817.5 as $M^+$ of the compound was confirmed. In addition, by differential scanning calorimetry (DSC), the melting point and the glass transition point were confirmed to be 267° C. and 143° C., respectively.

Synthesis Example of Compound 9

Compound 9

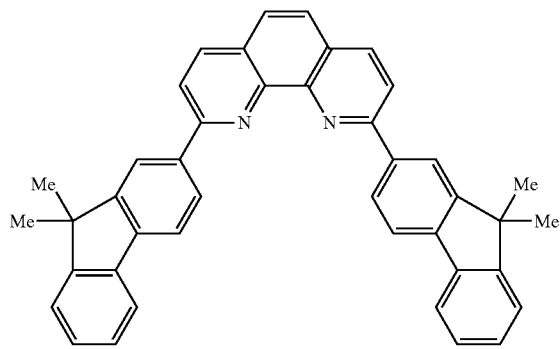

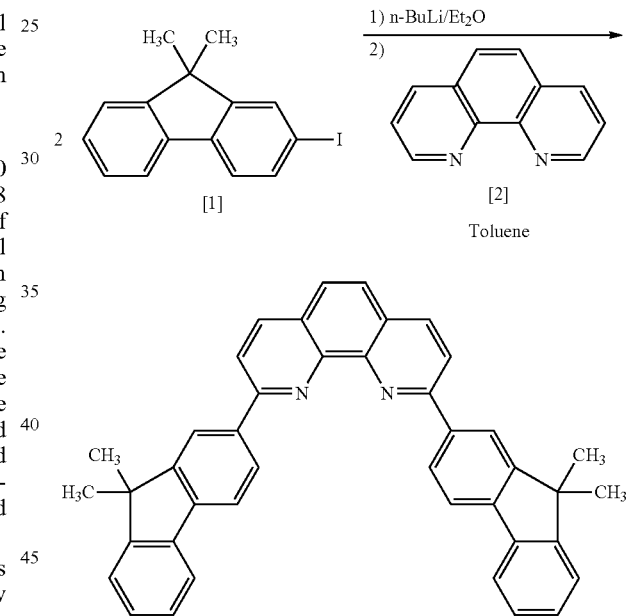

5.8 g (18.1 mmol) of 2-iodo-9,9-dimethyl fluorene [1] and 80 ml of diethyl ether were put in a 300-ml three-necked flask. The mixture was stirred at −78° C. under an atmosphere of nitrogen and 11.7 ml (18.1 mmol) of n-butyl lithium (15% hexane solution) were dropped thereto. The temperature of the mixture was increased to room temperature, followed by stirring for 1 hour. After that, the temperature was cooled to −20° C., and 100 ml of a toluene dispersion solution containing 0.81 g (4.51 mmol) of phenanthroline [2] were dropped thereto. After stirring at room temperature 12 hours, water was added thereto. An organic layer was extracted with chloroform and dried with anhydrous sodium sulfate. Then, the extracted resultant was purified with an alumina column (mixed developing solvent of hexane and chloroform), whereby 2.04 g (yield 80%) of Compound 9 (white crystal) were obtained.

Example 1

As the anode, a film of indium tin oxide (ITO) having a thickness of 130 nm was formed on a glass substrate as a substrate by a sputtering method, and the resultant was used as a transparent conductive supporting substrate. The resultant substrate was subjected to ultrasonic cleaning in acetone and isopropyl alcohol (IPA) in the stated order. Then, the substrate was washed in boiling IPA and dried. The substrate was further subjected to UV/ozone cleaning.

A chloroform solution was prepared so as to have a concentration of 0.1 wt % by using Compound 3 as a material for a hole injection layer.

The solution was dropped to the above-mentioned ITO electrode and spin coating was performed at a rotation number of 500 RPM for 10 seconds at first and then at a rotation number of 1,000 RPM for 1 minute to thereby form a film. For 10 minutes after that, the film was dried in a vacuum oven at 80° C. to remove the solvent in the thin film completely. The thickness of the formed hole injection layer was 11 nm.

Next, Compound 8 was formed into a film as a hole transport layer to have a thickness of 15 nm by using a vacuum deposition.

Next, an emission layer was formed by depositing simultaneously novel Compound 6 as a host material and Compound 7 as a luminescent dopant from the vapor from separate boats. The concentration of the luminescent dopant was 5 wt % and the thickness was 30 nm.

Further, Compound 9 was subjected to vacuum vapor deposition as an electron transport layer. The thickness of the electron transport layer was 30 nm.

Conditions at the time of vapor deposition of the organic compound layer were such that the vacuum degree was $7.0 \times 10^{-5}$ Pa or less and the film formation rate was 0.8 nm/sec or more to 1.0 nm/sec or less. Note that the deposition rate of the emission layer is a sum of both rates of the host and the dopant. In addition, the vacuum state from completion of the vapor deposition of the hole transport layer to the initiation of the vapor deposition of the emission layer was maintained, and the time therebetween was 10 minutes or less. The vacuum state from completion of the vapor deposition of the emission layer to the initiation of the vapor deposition of the electron transport layer was also maintained and the time therebetween was 10 minutes or less.

Next, lithium fluoride (LiF) was formed into a film having a thickness of 0.5 nm by a vacuum vapor deposition on the previous organic layer. Further, an aluminum film having a thickness of 150 nm was provided as an electron injection electrode (cathode) on the resultant by a vacuum vapor deposition, whereby an organic light emitting device was produced. The degree of vacuum at the time of the vapor deposition was $1.0 \times 10^{-4}$ Pa, lithium fluoride was formed into a film at a film formation rate of 0.05 nm/sec, and aluminum was formed into a film at a film formation rate of 1.0 nm/sec or more to 1.2 nm/sec or less.

The resultant organic light emitting device was covered with a protective glass plate and sealed with an epoxy-based adhesive in a nitrogen atmosphere at a dew point of −70° C. or lower in order that the adsorption of humidity might not occur. It should be noted that the adherent surface of the protective glass was provided with a dented portion to encapsulate a sheet for humidity adsorption (a humidity getter sheet for organic EL manufactured by DYNIC CORPORATION).

A voltage of 4.4 V was applied to the thus-obtained device while the ITO electrode (anode) was used as a positive electrode and the aluminum electrode (cathode) was used as a negative electrode. As a result, the device was observed to emit blue light derived from Compound 7 and having an emission luminance of 414 cd/m$^2$, a light emitting efficiency of 6.6 cd/A, and a maximum emission wavelength of 457 nm.

Further, when a voltage was applied to the device while the current density was kept at 100 mA/cm$^2$, the emission luminance of the device became 50% of the initial emission luminance after 161 hours and the durability performance was favorable.

Figure 9:
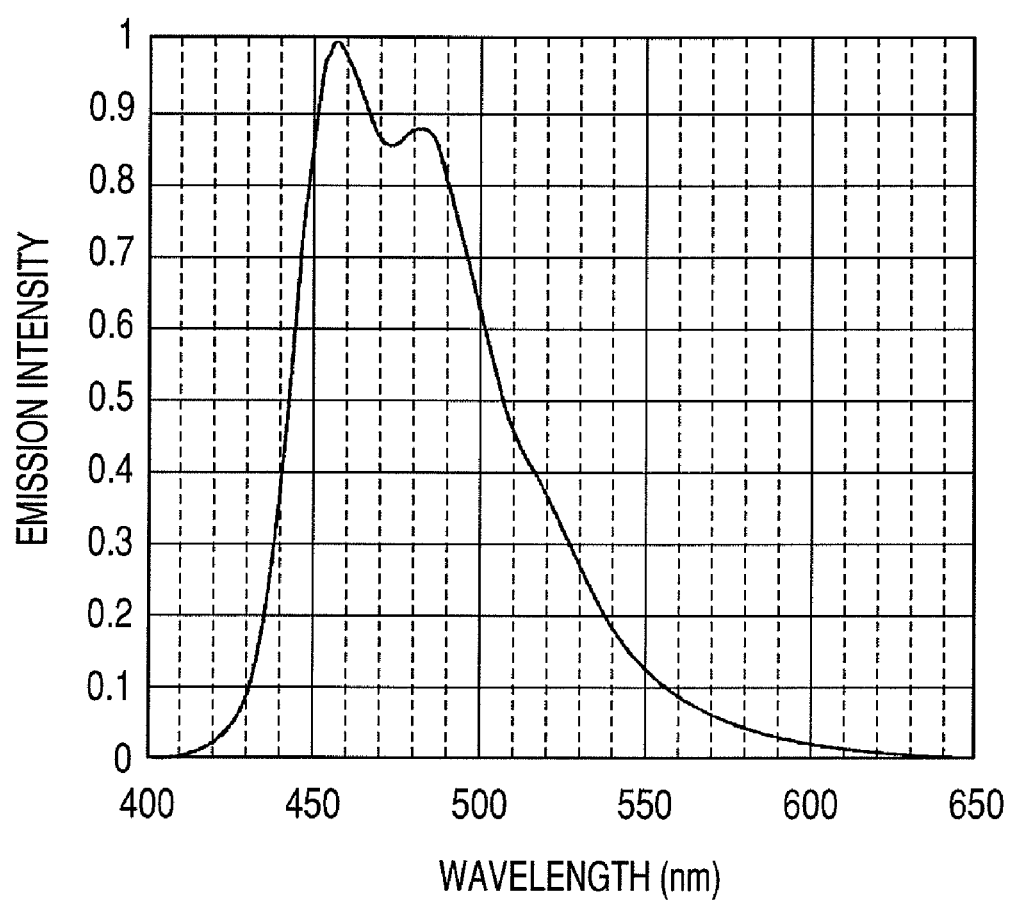
FIG. 9 illustrates a PL spectrum of a light emitting material of Example 1.

Next, an emission wavelength region of a luminescent dopant (light emitting material) was measured. A thin film having the same constitution as in the emission layer of this example was formed on a glass substrate directly. The photoluminescence of the sample was measured with a spectrofluorometer (apparatus name F4500) (FIG. 9). As a result, the emission wavelength region of the light emitting material was revealed to be 442 nm to 506 nm. Note that the luminescence was blue emission light having an xy chromaticity coordinate of (0.15, 0.18).

Next, the thin films of the host material and luminescent dopant of the emission layer were each produced by vacuum vapor deposition, and the ionization potential of each film was measured by using a photoelectron spectrometer in the air (apparatus name AC-1). Further, the energy gap and the electron affinity of each film were calculated by measuring an ultraviolet-visible light absorption spectrum (apparatus name U-3010). The results showed that the ionization potential of the host material was 5.79 eV, and the ionization potential of the luminescent dopant was 5.89 eV. Thus, in this example, a material having the smallest ionization potential in the emission layer was the host material. Further, the electron affinity of the host material and the electron affinity of the luminescent dopant were 2.84 eV and 3.08 eV, respectively. As a result, it is presumed that the luminescent dopant has remarkable electron trap performance, and the emission layer has sufficiently high electron density.

Next, a radical cation absorption spectrum of the host material was measured. FIG. 10 illustrates the result. There was not observed a convex shape higher than the measurement noise level in the emission wavelength region B of the light emitting material and it was revealed that there was no absorption peak.

In addition, the molar absorption coefficient was 10,000 or less in the emission wavelength region B of the light emitting material.

In addition, much recombination was supposed to occur at the electron transport layer side in the emission layer of the device.

Comparative Example 1

A device was produced in the same way as in Example 1 except that the host material of the emission layer was changed to Compound 10 below.

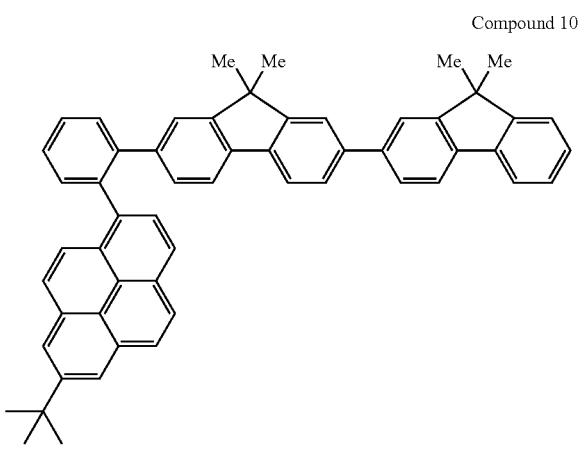 [SMILES: CC(C)(C)c1cc2ccc3ccc(-c4ccccc4-c4ccc5c(c4)C(C)(C)c4cc(-c6ccc7c(c6)C(C)(C)c6ccccc6-7)ccc4-5)c4ccc(c1)c2c34]

Compound 10

A voltage of 4.8 V was applied to the thus-obtained device while the ITO electrode (anode) was used as a positive electrode and the aluminum electrode (cathode) was used as a negative electrode. As a result, the device was observed to emit blue light derived from Compound 7 and having an emission luminance of 313 cd/m$^2$, a light emitting efficiency of 5.2 cd/A, and a maximum emission wavelength of 458 nm.

Further, when a voltage was applied to the device while the current density was kept at 100 mA/cm$^2$ under an atmosphere of nitrogen, the emission luminance of the device became 50% of the initial emission luminance after about 109 hours, resulting in deterioration of the durability performance compared to Example 1.

Next, the emission wavelength region of the luminescent dopant (light emitting material) was measured in the same way as in Example 1 and revealed to be 443 nm to 509 nm.

Next, the ionization potential and electron affinity of the host material of the emission layer were measured and calculated, and revealed to be 5.80 eV and 2.64 eV, respectively.

Therefore, in this examples, the host having the smallest ionization potential in the emission layer was the host material.

Next, the radical cation absorption spectrum of the host material was measured. FIG. 11 illustrates the absorption spectrum of the radical cation. It was revealed that an absorption peak A was present at about 473 nm and an absorption peak was present in the emission wavelength region B of the emission layer. The cause of impair of durability performance is supposed as follows: an energy transfer from the light emitting material (luminescent dopant) at excited state to radical cation of the host material occurs and the radical cation at excited state is generated.

Example 2

Figure 12:
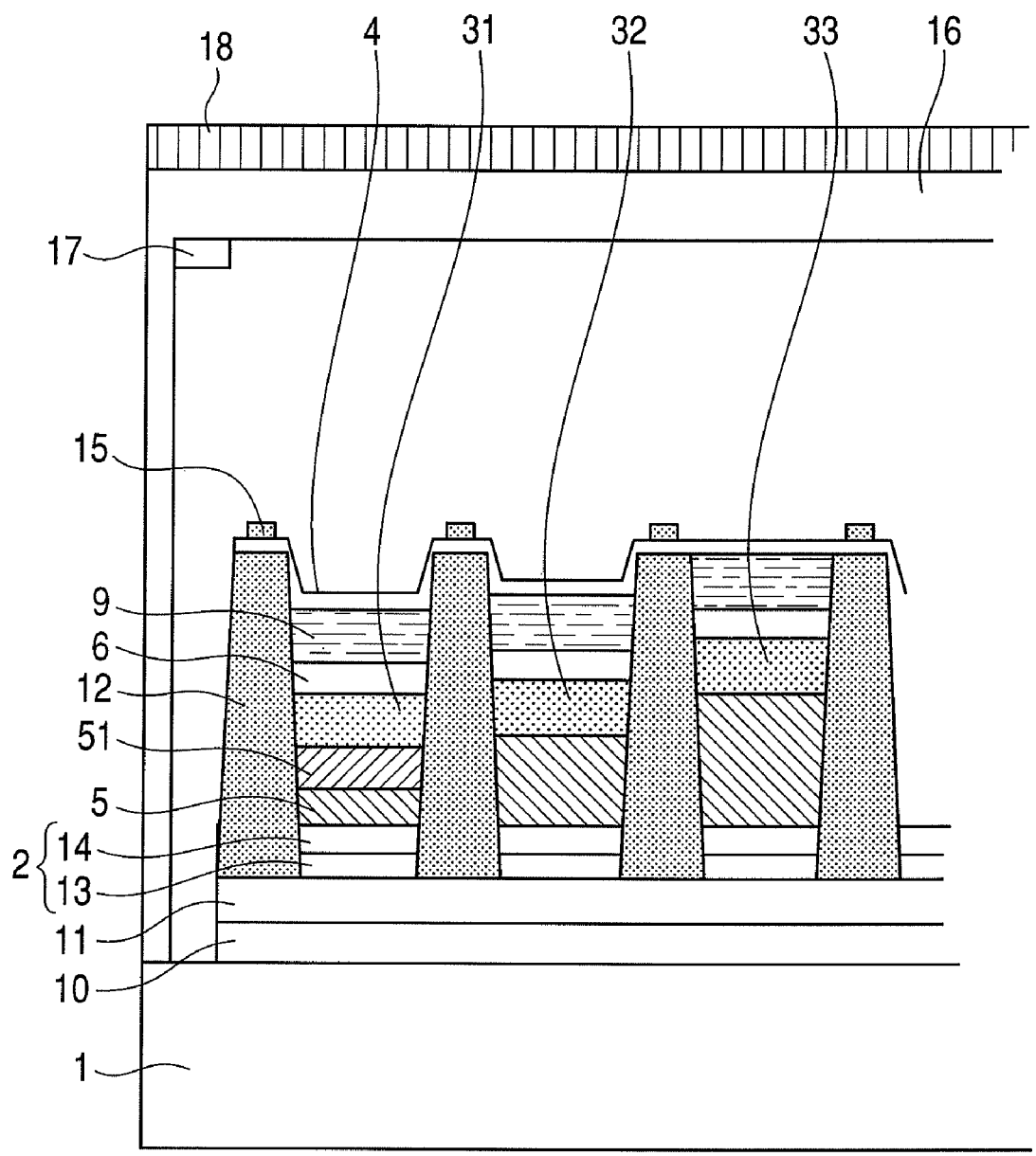
FIG. 12 is a sectional schematic view illustrating an example of an image display apparatus of the present invention.

An RGB full-color display apparatus mounted on a mobile device such as a digital still camera or digital video camera is described below. The display apparatus includes the organic light emitting device of the present invention in a blue (B) pixel of the display portion. In view of limit of source, it is desired that the electric power consumption of the display apparatus in a mobile device be low. Therefore, a display apparatus is produced with attention to the point in this example. FIG. 12 illustrates a sectional schematic view of the display apparatus.

A TFT driving circuit 10 of a low-temperature polysilicon which drives the organic light emitting device, a planarization film 11, an anode 2, and a pixel separation film 12 are formed on a substrate 1 used. The TFT driving circuit includes two-dimensionally arranged (640×3 colors)×480 pixels each having a diagonal size of 3.5 inches. In addition, the anode 2 is a laminate film including a reflective film 13 which is formed of an Ag alloy having a thickness of 50 nm and a transparent electrode 14 which is formed of ITO having a thickness of 60 nm. Each anode 2 is connected to the TFT driving circuit 10 through a contact hole formed on the planarization film 11. In addition, the pixel separation film 12 formed of a polyimide resin is formed between pixels.

The substrate was subjected to ultrasonic cleaning with acetone and IPA subsequently. Then, the resultant was washed in boiling IPA, followed by drying. Further, the resultant was subjected to UV/ozone cleaning. The substrate is introduced into a vacuum unit, whereby organic light emitting devices of RGB three colors are formed.

At first, Compound 3 was formed, as a hole transport layer 5, on all pixels to have a thickness of 60 nm by resistance heating. After that, Compound 8 was formed, as a second hole transport layer 51, on only blue pixels to have a thickness of 10 nm by using a shadow mask. Further, Compound 6 and Compound 7 were formed by simultaneous vapor deposition to have a thickness of 35 nm as a blue emission layer 31. A mixture ratio of the luminescent dopant (Compound 7) in the blue emission layer was 5 wt %.

Next, Compound 3 was formed on green pixels to have a thickness of 80 nm by using a shadow mask and the thickness of the hole transport layer was adjusted. Further, as a green emission layer 32, Compound 1 and Compound 5 were formed by simultaneous vapor deposition to have a thickness of 40 nm. The mixture ratio of the luminescent dopant (Compound 5) in the green emission layer was 15 wt %.

In addition, Compound 3 was formed on green pixels to have a thickness of 120 nm by using a shadow mask and the thickness of the hole transport layer was adjusted. Further, as a red emission layer 33, Compound 11 below and Compound 12 are formed by simultaneous vapor deposition to have a thickness of 30 nm. The mixture ratio of the luminescent dopant (Compound 12) in the red emission layer was 10 wt %.

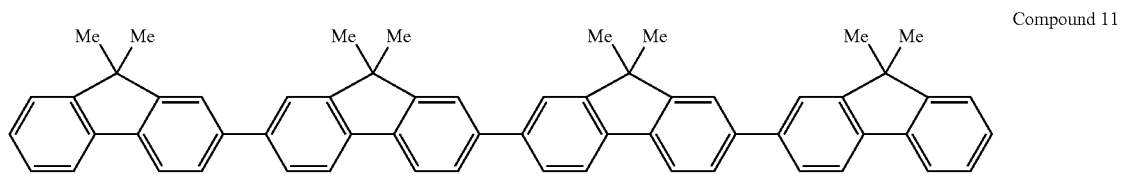

Compound 11

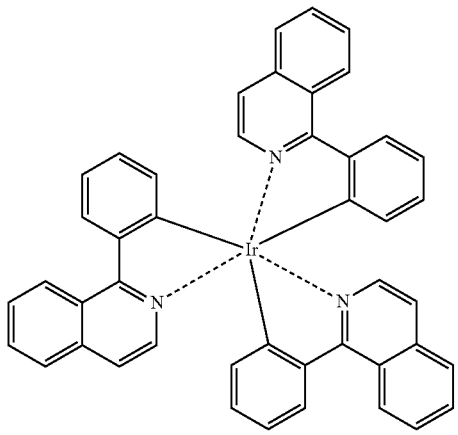

Compound 12

Thus, after the emission layers of each color of RGB were formed by using a shadow mask, Compound 9 was formed, as an electron transport layer 6, on all pixels to have a thickness of 10 nm. Further, Compound 9 and cesium carbonate were deposited simultaneously from the vapor to form the electron injection layer 9 having a thickness of 60 nm. The mixture ratio of the cesium carbonate in the electron injection layer was 3 wt %.

Note that, in the vapor deposition of the above-mentioned organic compounds, the vacuum degree was $7.0 \times 10^{-5}$ Pa or less and the film formation rate was 0.8 ns/sec or more to 1.0 ns/sec or less. In the case of simultaneous deposition, the deposition rate was a sum of both of the deposition rates.

Next, IZO was formed into a film having a thickness of 30 nm as the cathode 4. A film formation method included introducing argon and oxygen and using a facing targets sputtering (FTS) device.

In addition, the auxiliary electrode 15 formed of aluminum having a width of 8 μm was formed into a film having a thickness of 40 nm by resistance heating on the device separation film of the IZO cathode 4.

The thus produced substrate having an organic light emitting device was taken in an atmosphere of nitrogen (dew point, −80° C.) and the protective glass plate 16 having a 0.3-mm convex was bonded thereto to cover the substrate. The getter sheet 17 (manufactured by DYNIC CORPORATION) for moisture adsorption having a width of 0.5 mm was adhered along the inner wall surface of the protective glass.

Further, the circular polarizing plate 18 was provided on the protective glass plate for the purpose of preventing reflection of ambient light.

The thus obtained display apparatus could obtain an organic light emitting device having higher efficiency by changing the thickness of the hole transport layer and the thickness of the emission layer depending on the emission color and adjusting the optical interference distance to obtain an appropriate thickness for the organic light emitting device. In addition, by using the phosphorescent material as a luminescent dopant as a red emission layer, an organic light emitting device having higher efficiency could be obtained. Further, the auxiliary electrode 15 was used for compensating the electric conductivity of the cathode having a relatively thin thickness of 30 nm. As a result, the auxiliary electrode 15 had effects of preventing voltage drop due to the cathode part and reducing electric power necessary for driving the display apparatus. As a result, the thus obtained display apparatus, as a display apparatus such as a mobile device having a limit source capacity, solves the problem of lifetime and also is effective from the viewpoint of power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priorities from Japanese Patent Applications No. 2008-129577, filed May 16, 2008 and No. 2009-097227, filed Apr. 13, 2009, which are hereby incorporated by reference herein.

The invention claimed is:

1. An organic light emitting device comprising:
an anode;
a cathode; and
an emission layer formed of an organic compound arranged between the anode and the cathode,
wherein the emission layer comprises a light emitting material which emits fluorescence and a material having a smallest ionization potential among materials in the emission layer; and
wherein an absorption spectrum in a radical cation state of the material having the smallest ionization potential in the emission layer does not have its absorption peak in an emission wavelength region of the light emitting material.

2. The organic light emitting device according to claim 1, wherein the light emitting material emits blue light.

3. The organic light emitting device according to claim 1, wherein, in the emission wavelength region of the light emitting material which emits fluorescence, a molar absorption coefficient in the radical cation state of the material having the smallest ionization potential in the emission layer is 10,000 L/(mol·cm) or less.

4. The organic light emitting device according to claim 1, wherein a concentration of the material having the smallest ionization potential is 20 wt % or more in the emission layer.

5. The organic light emitting device according to claim 1, wherein the material having the smallest ionization potential in the emission layer is a host material and the light emitting material is a dopant material; and wherein an electron affinity of the host material EAH and an electron affinity of the dopant material EAD has the following relationship:

$$EAD-EAH \geq 0.15 \text{ eV}.$$

6. An image display apparatus comprising:
the light emitting device according to claim 1 as a display portion; and
a driving portion for driving the display portion.

7. The image display apparatus according to claim 6, wherein the driving portion comprises a switch for adjusting an emission period of the organic light emitting device in one frame period in order to adjust brightness of a display image.

8. A camera comprising the organic light emitting device according to claim 1 as a display portion.

9. The organic light emitting device according to claim 1, wherein the material having a smallest ionization potential among materials in the emission layer is a host material.

10. The organic light emitting device according to claim 1, wherein the emission layer comprises a host material and a plurality of light emitting materials, and wherein the emission layer emits white color.

11. The organic light emitting device according to claim 10 further comprising a color filter.

12. The organic light emitting device according to claim 1 further comprising a color filter.

13. An image-forming apparatus including a light source, wherein the light source comprises the organic light emitting device according to claim 1.

14. An organic light emitting device comprising:
an anode;
a cathode; and
an emission layer formed of an organic compound arranged between the anode and the cathode,
wherein the emission layer comprises a light emitting material which emits fluorescence and a material having a smallest ionization potential among materials in the emission layer;
wherein an absorption spectrum in a radical cation state of the material having the smallest ionization potential in the emission layer does not have its absorption peak in an emission wavelength region of the light emitting material;
wherein the light emitting material emits blue light;
wherein in the emission wavelength region of the light emitting material, a molar absorption coefficient in the radical cation state of the material having the smallest ionization potential in the emission layer is 10,000 L/(mol·cm) or less;
wherein the material having the smallest ionization potential in the emission layer is a host material and the light emitting material is a dopant material; and
wherein an electron affinity of the host material EAH and an electron affinity of the dopant material EAD has the following relationship:

$$EAD-EAH \geq 0.15 \text{ eV}.$$

\* \* \* \* \*